US010160098B2

(12) United States Patent
Lim

(10) Patent No.: US 10,160,098 B2
(45) Date of Patent: Dec. 25, 2018

(54) CLEANING APPARATUS FOR WIRE CLAMP AND CLEANING SYSTEM INCLUDING THE SAME

(71) Applicant: SAMSUNG ELECTRONICS CO., LTD., Suwon-si, Gyeonggi-do (KR)

(72) Inventor: Jun-suk Lim, Cheonan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 126 days.

(21) Appl. No.: 15/158,823

(22) Filed: May 19, 2016

(65) Prior Publication Data

US 2017/0028445 A1 Feb. 2, 2017

(30) Foreign Application Priority Data

Jul. 31, 2015 (KR) ........................ 10-2015-0108867

(51) Int. Cl.
*B24D 15/02* (2006.01)
*B24B 49/00* (2012.01)
*B08B 1/00* (2006.01)

(52) U.S. Cl.
CPC .............. *B24D 15/023* (2013.01); *B08B 1/00* (2013.01); *B24B 49/00* (2013.01)

(58) Field of Classification Search
CPC ............................ B24B 23/046; B24D 15/023
See application file for complete search history.

(56) References Cited

U.S. PATENT DOCUMENTS 570,456 A * 11/1896 Collins ................ B24D 15/023 451/517
1,181,123 A * 5/1916 Edenborough ...... B24D 15/023 451/515
2,103,320 A * 12/1937 Corff .................... B24D 15/023 15/231
2,302,424 A * 11/1942 Delnostro ............. B24B 23/046 451/344
2,507,017 A * 5/1950 Jenkins ................ H02G 1/1285 451/512
2,531,588 A * 11/1950 Stucker ................ B24D 15/023 451/504
2,624,161 A * 1/1953 Snell .................... B24D 15/023 451/512
3,175,334 A * 3/1965 Price ....................... A47L 13/10 451/525
4,361,990 A * 12/1982 Link .................... B24D 15/023 451/524
4,922,663 A * 5/1990 Nakagawa ............ B24B 23/046 451/359

(Continued)

FOREIGN PATENT DOCUMENTS

KR 10-0585600 B1 6/2006
KR 10-1165032 B1 7/2012

*Primary Examiner* — Timothy V Eley
(74) *Attorney, Agent, or Firm* — Lee & Morse P.C.

(57) ABSTRACT

A cleaning apparatus, including a body; a tip connected to a first end of the body, the tip including a support extending in a direction away from the body; a polishing member including a first surface including a polishing surface and a second surface opposite to the first surface; and a fixer to adhere and fix the polishing member to the support so that the polishing surface is brought in contact with a cleaning target surface.

19 Claims, 8 Drawing Sheets

200
211
210
121
100
130
140
110

(56) References Cited

U.S. PATENT DOCUMENTS

| | | | | |
|---|---|---|---|---|
| 4,995,200 | A * | 2/1991 | Eberhart | B24D 15/023 451/490 |
| 5,359,818 | A * | 11/1994 | Costa | B24D 15/026 451/492 |
| 5,901,896 | A | 5/1999 | Gal | |
| 7,229,345 | B2 * | 6/2007 | Fierus | B24D 15/065 451/523 |
| 7,810,695 | B2 | 10/2010 | Park et al. | |
| 7,841,505 | B2 | 11/2010 | Lee et al. | |
| 8,662,089 | B2 | 3/2014 | Hwang | |
| 9,352,449 | B1 * | 5/2016 | Winter | B24D 15/023 |
| 2005/0184133 | A1 | 8/2005 | Clauberg et al. | |
| 2007/0232204 | A1 * | 10/2007 | Takeichi | B24B 9/14 451/56 |
| 2009/0039141 | A1 | 2/2009 | Clauberg et al. | |
| 2014/0256237 | A1 * | 9/2014 | Momper | B24D 15/023 451/490 |
| 2014/0263584 | A1 | 9/2014 | Yap et al. | |
| 2015/0088241 | A1 | 3/2015 | Liu et al. | |
| 2015/0258662 | A1 * | 9/2015 | Ditto | B24D 15/023 451/524 |

* cited by examiner

CLEANING APPARATUS FOR WIRE CLAMP AND CLEANING SYSTEM INCLUDING THE SAME

CROSS-REFERENCE TO RELATED APPLICATION

Korean Patent Application No. 10-2015-0108867, filed on Jul. 31, 2015, in the Korean Intellectual Property Office, and entitled: "Cleaning Apparatus for Wire Clamp and Cleaning System Including the Same," is incorporated by reference herein in its entirety.

BACKGROUND

1. Field

Embodiments relate to a cleaning apparatus for a wire clamp and a cleaning system including the cleaning apparatus.

2. Description of the Related Art

Equipment used in a semiconductor process may need to be operated with high precision, and contamination by a particle that may occur during the process may greatly influence product quality. Cleaning may be performed to remove a contamination factor of semiconductor equipment, the inside of a narrow gap may be cleaned by dissembling, cleaning, and reassembling the equipment, and a fatal defect may occur due to, for example, a lack of precision between components of the equipment during a dissembling and reassembling process.

SUMMARY

Embodiments may be realized by providing a cleaning apparatus, including a body; a tip connected to a first end of the body, the tip including a support extending in a direction away from the body; a polishing member including a first surface including a polishing surface and a second surface opposite to the first surface; and a fixer to adhere and fix the polishing member to the support so that the polishing surface is brought in contact with a cleaning target surface.

The fixer may include a first fixer including a through hole providing an inner side surface and a second fixer engaged with the first fixer, the fixer to fix the polishing member such that the polishing member is fixedly sandwiched between the inner side surface of the first fixer and the support.

The support may include a pair of horizontal surfaces that face each other and a pair of first inclination surfaces extending from a first end of the pair of horizontal surfaces in a direction opposite to a first end of the tip, and a distance between the pair of first inclination surfaces may increase the farther away the pair of first inclination surfaces are from the pair of horizontal surfaces.

The inner side surface of the first fixer may include inner side inclination surfaces corresponding to the pair of first inclination surfaces.

The inner side surface of the first fixer may have a shape corresponding to a part of the pair of horizontal surfaces and the pair of first inclination surfaces.

The pair of first inclination surfaces may include a seating groove accommodating a part of the polishing member, and the first fixer may include a protrusion that is insertable into the seating groove.

The support may include a pair of horizontal surfaces that face each other and a pair of second inclination surfaces extending from the pair of horizontal surfaces to a first end of the tip, and a distance between the pair of second inclination surfaces may be reduced the farther away the pair of second inclination surfaces are from the pair of horizontal surfaces.

The first end may be convex.

The body and the tip may be detachable from each other.

The cleaning apparatus may further include a cover to protect the tip.

Embodiments may be realized by providing a cleaning system, including a cleaning apparatus including a polishing member to clean clamp pads provided in a wire clamp, a support to support the polishing member, and a fixer to fix the polishing member to the support; a detector to provide contamination information of the clamp pads provided in the wire clamp; and a driver to insert the cleaning apparatus into the wire clamp to clean the clamp pads using the polishing member of the cleaning apparatus based on information detected by the detector.

The fixer may include a first fixer including a through hole providing an inner side surface and a second fixer engaged with the first fixer, the fixer to fix the polishing member such that the polishing member is fixedly sandwiched between the inner side surface of the first fixer and the support.

The support may include a pair of horizontal surfaces that face each other and a pair of second inclination surfaces extending from the pair of horizontal surfaces to a first end of a tip, and a distance between the pair of second inclination surfaces may be reduced the farther away the pair of second inclination surfaces are from the pair of horizontal surfaces.

The support may have a symmetrical structure.

The polishing member may be a diamond polishing tape.

Embodiments may be realized by providing a cleaning apparatus, including a tip including opposite horizontal surfaces and a first end; and a polishing member folded to cover the horizontal surfaces and the first end.

The horizontal surfaces may be connected by the first end.

The cleaning apparatus may further include an inclination surface between each of the horizontal surfaces and the first end.

Each inclination surface may be formed by chamfering a corner where one of the horizontal surfaces and the first end meet each other.

A distance between the horizontal surfaces may be about 0.4 mm, and a width of the first end may be about 0.3 mm.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
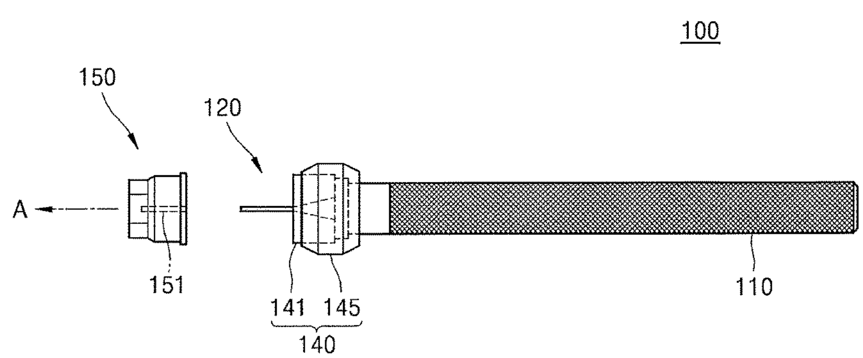
FIG. 1 illustrates a lateral view of a cleaning apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of structures may be exaggerated for clarity. It will be understood that when an element is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items. Expressions such as "at least one of", when preceding a list of elements, modify the entire list of elements and do not modify the individual elements of the list.

Also, though terms "first" and "second" are used to describe various members, components, regions, layers, and/or portions in various embodiments, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Spatially relative terms, such as "above", "upper", "beneath", "below", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, exemplary embodiments will be described with reference to the accompanying drawings. In the accompanying drawings, the modifications of the illustrated shapes may be expected according to manufacturing technologies and/or tolerances. Therefore, the exemplary embodiments should not be construed as being limited to specific shapes of the illustrated regions. The shapes may be changed during the manufacturing processes. The following exemplary embodiments may be combined.

A cleaning apparatus and a cleaning apparatus for a wire clamp described herein may have various configurations. Only necessary configurations thereof are illustrated herein, and exemplary embodiments are not limited thereto.

Figure 2:
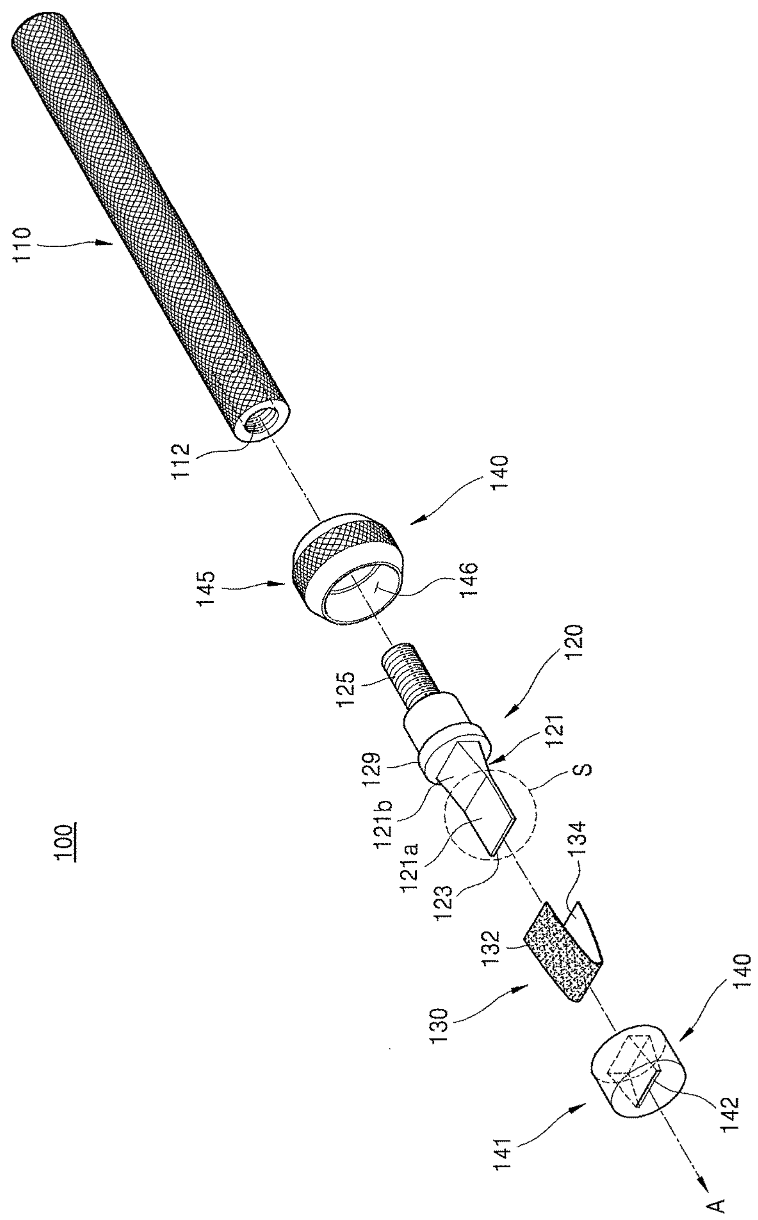
FIG. 2 illustrates an exploded perspective view of a cleaning apparatus according to an exemplary embodiments.

FIG. 1 illustrates a lateral view of a cleaning apparatus 100 according to an exemplary embodiment. FIG. 2 illustrates an exploded perspective view of the cleaning apparatus 100 according to an exemplary embodiment.

Referring to FIGS. 1 and 2, the cleaning apparatus 100 may include a body unit 110, a tip unit 120, a polishing member 130, a fixing unit 140, and a cover unit 150.

The tip unit 120 may have a structure suitable for being inserted into a narrow gap in order to clean a cleaning target surface located in the narrow gap. The tip unit 120 may include a support unit 121 that is connected to one end of the body unit 110 and extend in a direction away from the body unit 110 and a connection unit 125 that extends in a direction of the body unit 110. The support unit 121 may provide a main surface that may be in contact with and may be fixed to the polishing member 130 that will be described later.

The support unit 121 may include a pair of horizontal surfaces 121*a*, a pair of first inclination surfaces 121*b* extending from one end of the pair of horizontal surfaces 121*a*, and a pair of second inclination surfaces 121*c* extending from another end of the pair of horizontal surfaces 121*a* and to a fore-end unit 123 at a first end of the tip unit 120. The pair of second inclination surfaces 121*c* are omitted in FIG. 1. The pair of second inclination surfaces 121*c* will be described later with reference to FIG. 5.

The support unit 121 may perform cleaning by contacting the polishing member 130 fixed to the main surface of the support unit 121 with the cleaning target surface and may have a symmetrical structure. When a pair of cleaning target surfaces that face each other are cleaned, the support unit 121 may be manufactured as the symmetrical structure, and a uniform contact pressure may be applied to the pair of cleaning target surfaces.

The body unit 110 may be gripped by an operator or may be connected to a driving mechanism. In order to prevent sliding when the body unit 110 is gripped, an outer circumference of the body unit 110 may have a knurling surface. A coupling hole 112 for coupling the body unit 110 and the tip unit 120 may be formed in one end of the body unit 110 that is connected to the tip unit 120. The coupling hole 112 may have a size and a shape suitable for accommodating the connection unit 125. A screw thread may be formed in an inner surface of the coupling hole 112. A screw thread that engages the screw thread of the coupling hole 112 may be formed in an outer circumference of the connection unit 125. However, this is merely one of methods of coupling the body unit 110 and the tip unit 120. A protrusion may be formed in one end of the body unit 110 and may be inserted into a hole formed in one end of the tip unit 120. Other methods may be used to detachably couple the body unit 110 and the tip unit 120. As described above, the body unit 110 and the tip unit 120 may be detached from each other. When the tip unit 120 or the body unit 110 is damaged, the tip unit 120 or the body unit 110 may be exchanged to be used.

The polishing member 130 may include a first surface 132 and a second surface 134, that face each other. The first surface 132 may include a polishing surface coated with polishing particles. The second surface 134 may be in contact with the main surface of the support unit 121 and the fore-end unit 123 and may be closely fixed to the support unit 121 by the fixing unit 140 that will be described later.

The polishing particles may use, for example, alumina ($Al_2O_3$), cerium oxide ($CeO_2$), silica ($SiO_2$), diamond, silicon carbide (SiC), chrome oxide ($Cr_2O_3$), zirconia ($ZrO_2$), cubic boron nitride (cBN), or a mixture thereof.

In some exemplary embodiments, the polishing member 130 may use a polishing tape manufactured by distributing and coating the polishing particles on a support structure such as a plastic base film, e.g., polyimide, or paper. A type of the polishing particles used in the polishing member 130 may be determined according to a type of the cleaning target surface. A size of the polishing tape may be determined according to a size of the cleaning target surface or a shape of the tip unit 120.

The fixing unit 140 may allow the polishing member 130 to be closely fixed to the support unit 121. To apply a sufficient contact pressure to the cleaning target surface when cleaning is performed, a state in which the fixing unit 140 is sufficiently adhered to the main surface of the support unit 121 needs to be maintained. The fixing unit 140 may provide tension that pulls both ends of the polishing member 130 so that a state in which the polishing member 130 is adhered to the support unit 121 may be maintained.

The fixing unit 140 may include a first fixing unit 141 and a second fixing unit 145. A through hole 142 that passes one end of the first fixing unit 141 through another end thereof may be formed in the first fixing unit 141, and the first fixing unit 141 may include an inner side surface that is an inner wall of the through hole 142. The through hole 142 may accommodate a part of the support unit 121. The polishing member 130 may be sandwiched between the inner side surface of the first fixing unit 141 and the support unit 121.

Meanwhile, the second fixing unit 145 may be connected to the tip unit 120 in an opposite direction to a direction in which the first fixing unit 141 is coupled to the tip unit 120. An opening unit 146 formed inside the second fixing unit 145 may accommodate a part of the tip unit 120. An external step 129 may be formed along an outer circumference of the tip unit 120. A step that engages the external step 129 may be formed in an inner side of the second fixing unit 145, and the second fixing unit 145 may be restricted to move in an axial direction A. The second fixing unit 145 may be fastened to the first fixing unit 141. The opening unit 146 may accommodate at least a part of the first fixing unit 141. An outer circumference of the first fixing unit 141 may be in contact with a part of an inner circumference of the second fixing unit 145. The first fixing unit 141 may be fastened to the second fixing unit 145, and the first fixing unit 141 may be coupled to the tip unit 120 and may continuously apply pressure to the polishing member 130 disposed on the inner side surface of the first fixing unit 141. The first fixing unit 141 and the second fixing unit 145 may be engaged with each other using a mechanical engagement method. For example, screw threads may be formed in an outer circumference of the first fixing unit 141 and an inner circumference of the second fixing unit 145.

The cover unit 150 may be blocked from the outside by covering the tip unit 120 and may be used to prevent damage to the tip unit 120 while the cleaning apparatus 100 is not used. A blind hole 151 into which the tip unit 120 may be inserted may be formed in the cover unit 150. The blind hole 151 may, for example, be formed to have a shape corresponding to a shape of a part of the support unit 121. The blind hole 151 may have a shape that prevents the support unit 121 from being exposed to the outside.

Figure 3A:
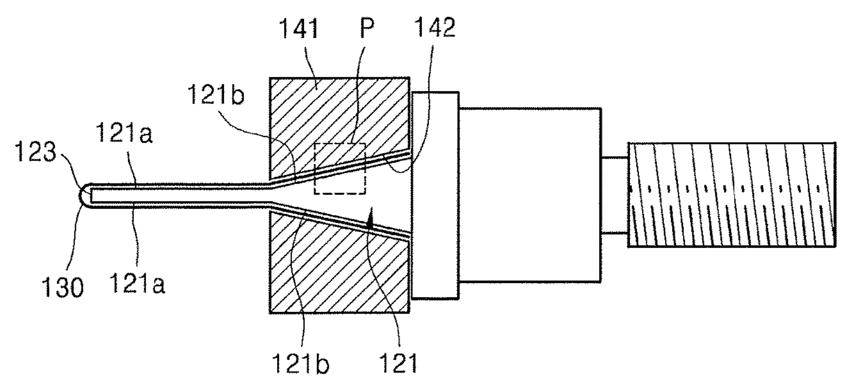
FIGS. 3A and 3B illustrate cross-sectional views of a part of a cleaning apparatus according to an exemplary embodiment.
Figure 3B:
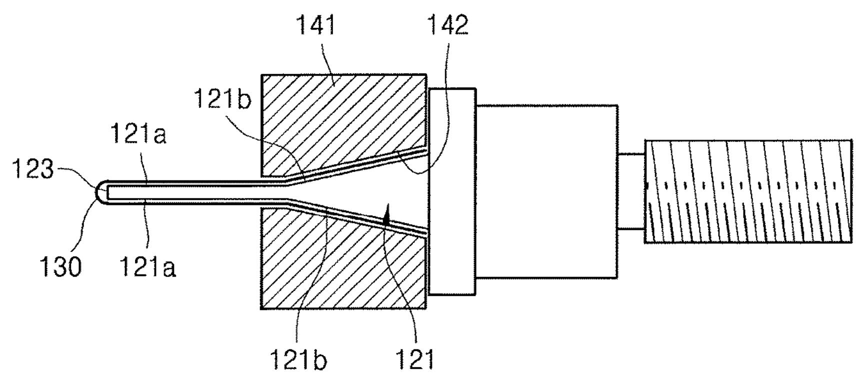

FIGS. 3A and 3B are cross-sectional views of a part of a cleaning apparatus according to an exemplary embodiment.

Referring to FIGS. 2 and 3A, the support unit 121 may include the pair of horizontal surfaces 121*a* facing each other and the pair of first inclination surfaces 121*b* extending from one end of the pair of horizontal surfaces 121*a* in a direction away from the fore-end unit 123 of the top unit 120. A distance between the pair of first inclination surfaces 121*b* may increase farther away from the fore-end unit 123. A distance between the pair of first inclination surfaces 121*b* may increase farther away from the pair of horizontal surfaces 121*a*.

The through hole 142 formed in the first fixing unit 141 may be formed to accommodate the pair of first inclination surfaces 121*b*, and an inner side surface of the first fixing unit 141 may include an inner side inclination surface corresponding to the pair of first inclination surfaces 121*b*. The polishing member 130 may be fixed by being sandwiched between the inner side surface of the first fixing unit 141 formed to correspond to the pair of first inclination surfaces 121*b* and the pair of first inclination surfaces 121*b*. The polishing member 130 may be sandwiched between the inclined pair of first inclination surfaces 121*b* and the inner side surface of the first fixing unit 141, a friction force applied to the polishing member 130 may increase, a force pulling both ends of the polishing member 130 may be increased, and a state in which the polishing member 130 is adhered to the support unit 121 may be effectively maintained.

Referring to FIGS. 2 and 3B, the through hole 142 formed in the first fixing unit 141 may be formed to accommodate a part of the pair of horizontal surfaces 121*a* and the pair of first inclination surfaces 121*b* extending from the pair of horizontal surfaces 121*a*, and the inner side surface of the first fixing unit 141 may have a shape corresponding to the part of the pair of horizontal surfaces 121*a* and the pair of first inclination surfaces 121*b*. The polishing member 130 may be sandwiched in a part of the pair of horizontal surfaces 121*a* adjacent to a boundary between the pair of horizontal surfaces 121*a* and the pair of first inclination surfaces 121*b*, and the polishing member 130 may be prevented from being detached from the part adjacent to the boundary between the pair of horizontal surfaces 121*a* and the pair of first inclination surfaces 121*b*.

Figure 4:
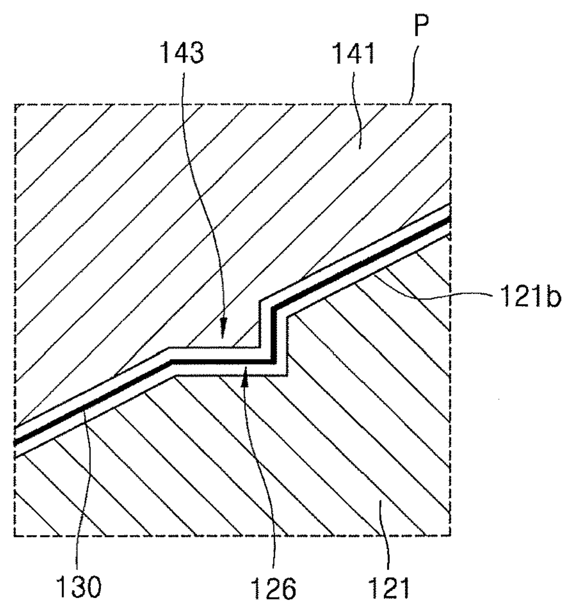
FIG. 4 illustrates an enlarged cross-sectional view of a region P of FIG. 3A.

FIG. 4 illustrates an enlarged cross-sectional view of a region P of FIG. 3A.

Referring to FIG. 4, a seating groove 126 that may accommodate a part of the polishing member 130 may be formed in at least one of the pair of first inclination surfaces 121*b*, and a protrusion unit 143 that may be inserted into the seating groove 126 may be formed in an inner side surface of the first fixing unit 141. The polishing member 130 may be inserted into the seating groove 126 by the protrusion unit 143. A part of the polishing member 130 may be inserted into the seating groove 126 and fixed by the protrusion unit 143, and the polishing member 130 may be prevented from being detached from the support unit 121 due to, for example, a shaking of the polishing member 130 during a process of cleaning a cleaning target surface.

Figure 5:
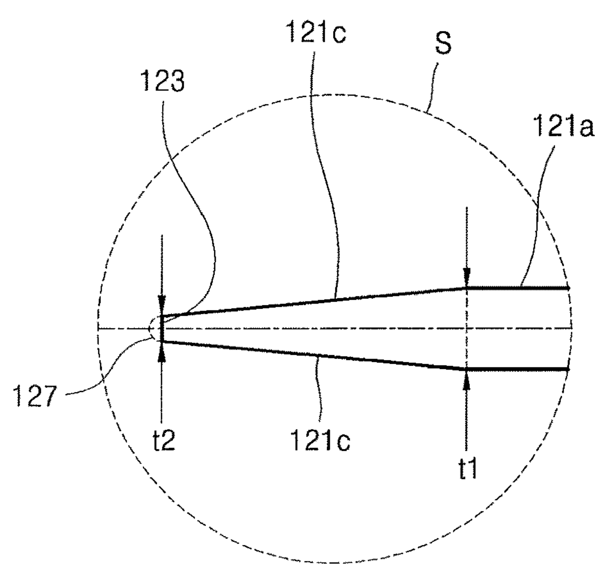
FIG. 5 illustrates an enlarged lateral view of a region S of FIG. 2.

FIG. 5 illustrates an enlarged lateral view of a region S of FIG. 2.

Referring to FIGS. 2 and 5, the support unit 121 may include the pair of horizontal surfaces 121*a*, the pair of first inclination surfaces 121*b* extending from one end of the pair of horizontal surfaces 121*a*, and the pair of second inclination surfaces 121*c* extending from another end of the pair of horizontal surfaces 121*a* and to the fore-end unit 123 of the tip unit 120.

A distance between the pair of second inclination surfaces 121*c* may be reduced closer to the fore-end unit 123. A distance between the pair of second inclination surfaces 121*c* may be reduced farther away from the pair of horizontal surfaces 121*a*. A distance t1 between the pair of horizontal surfaces 121*a* may be greater than a width t2 of the fore-end unit 123. The distance t1 between the pair of horizontal surfaces 121*a* may be about 0.4 mm. The width t2 of the fore-end unit 123 may be about 0.3 mm.

The second inclination surfaces 121*c* may be formed by chamfering corners where the pair of horizontal surfaces 121*a* and the fore-end unit 123 meet each other.

The tip unit 120 may be adjacent to the fore-end unit 123 and include the pair of second inclination surfaces 121*c*, and an area on which cleaning is performed may be substantially increased. The polishing member 130 may be folded to cover the pair of horizontal surfaces 121*a* and the fore-end unit 123. When the pair of second inclination surfaces 121*c* is not provided, the fore-end unit 123 may be located in end portions of the pair of horizontal surfaces 121*a*. In this case, the polishing member 130 may not be adhered to the support unit 121 around adjacent to the fore-end unit 123 and may be detached from the support unit 121. As described above, a part where the polishing member 130 is not adhered to the support unit 121 and is detached from the support unit 121 may not be completely cleaned since a sufficient contact pressure is not applied to a cleaning target surface. Thus, the support unit 121 may include the pair of second inclination surfaces 121*c* extending from the pair of horizontal surfaces 121*a* and to the fore-end unit 123, and the detached part that may occur when the polishing member 130 is folded around adjacent to the fore-end unit 123 may be reduced. A thickness of the pair of second inclination surfaces 121*c* may be reduced closer to the fore-end unit 123, and the pair of second inclination surfaces 121*c* may be easily inserted into a narrow gap.

In some exemplary embodiments, a convex unit 127 may be further included in the fore-end unit 123 of the tip unit 1230. When two points on a surface of the convex unit 127 are connected in a straight line, the straight line is present in the tip unit 120. The convex unit 127 may remove a part in which an inclination rapidly changes between the fore-end unit 123 and the second inclination surfaces 121*c* so that the polishing member 130 may be adhered to the support unit 121 around the fore-end unit 123. Accordingly, the polishing member 130 may also be adhered to the support unit 121 around the fore-end unit 123, and a contact pressure may be effectively applied to a cleaning target surface when cleaning is performed. The convex unit 127 may be connected to ends of the pair of second inclination surfaces 121*c* as shown in FIG. 5. In an embodiment, the pair of second inclination surfaces 121*c* may be omitted, and the convex unit 127 may be directly connected to ends of the pair of horizontal surfaces 121*a*.

Figure 6:
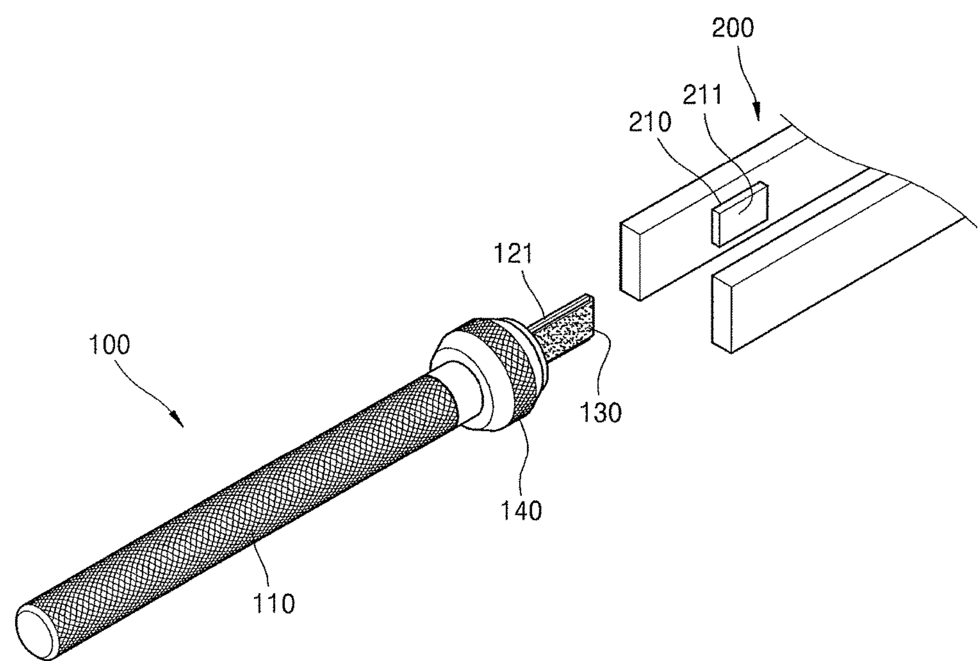
FIG. 6 illustrates a schematic diagram for explaining a cleaning apparatus that is used to clean a wire clamp according to an exemplary embodiment.

FIG. 6 illustrates a schematic diagram for explaining a cleaning apparatus that is used to clean a wire clamp 200 according to an exemplary embodiment.

Referring to FIG. 6, the wire clamp 200 may be used in a wire bonding process among semiconductor package manufacturing processes. The wire bonding process may be a process of electrically connecting a bonding pad formed in a die bonded semiconductor device and an external connection terminal of a semiconductor package using, for example, a minute wire. The wire may be supplied via a capillary by a closing and opening action of the wire clamp 200 to connect the bonding pad of a chip and the terminal of the package.

The wire may pass between clamp pads 210 facing each other with a narrow gap disposed therebetween, and the wire clamp 200 may apply tension to the wire by restricting or removing the wire according to an electrical signal.

The clamp pads 210 may be formed of a metal containing material, for example, sapphire. The wire may be formed of a conductive material such as, for example, gold (Au), sliver (Ag), platinum (Pt), aluminum (Al), copper (Cu), palladium (Pd), nickel (Ni), cobalt (Co), chrome (Cr), or titanium (Ti). Particles generated from the wire or other particles generated by an action between the particles and the outside may be attached to one surface 211 of the clamp pads 210 directly in contact with the wire. These particles may cause a product defect because of a characteristic of a semiconductor manufacturing process requiring a high level precision, and the clamp pads 210 need to be cleaned on a regular basis.

Although a strong contact pressure may be applied to one surface 211 of the clamp pads 210 in order to clean the clamp pads 210, since the clamp pads 210 may be located with the narrow gap therebetween, it may be difficult to clean the clamp pads 210. Thus, as an alternative, a process of dissembling, cleaning, and assembling the clamp pads 210 may be required. However, such a dissembling and assembling process may cause a wrong precision or a change in the gap between the clamp pads 210 and a fatal defect of wire bonding facility requiring a high level precision. Furthermore, a skilled expert may be needed for cleaning that involves such dissembling and assembling, which may cause an increase in personnel expenses, and an overall processing cost may increase.

In the exemplary embodiments, the clamp pads 210 located with the narrow gap therebetween may be cleaned by the cleaning apparatus 100 without dissembling and assembling the clamp pads 210. The polishing member 130 may be fixed to the support unit 121 by the fixing unit 140. Tension may be applied to both ends of the polishing member 130 so that the polishing member 130 may be adhered to the support unit 121. Accordingly, the support unit 121 may be inserted into the narrow gap so that a contact pressure enough to clean one surface 211 of the clamp pads 210 on which a contaminant of the clamp pads 210 is formed may be applied. Therefore, the cleaning apparatus 100 may clean only a contaminated surface of the wire clamp 200 without a process of dissembling the wire clamp 200, and problems caused by the dissembling and assembling process may be prevented, and additionally a cleaning time may be reduced, for example, to within, or by, 1 minute, by omitting the dissembling and assembling process.

The pair of clamp pads 210 that face each other may include a sapphire surface in contact with the wire. The polishing member 130 may use a diamond polishing tape as a material for effectively cleaning the sapphire surface.

Figure 7:
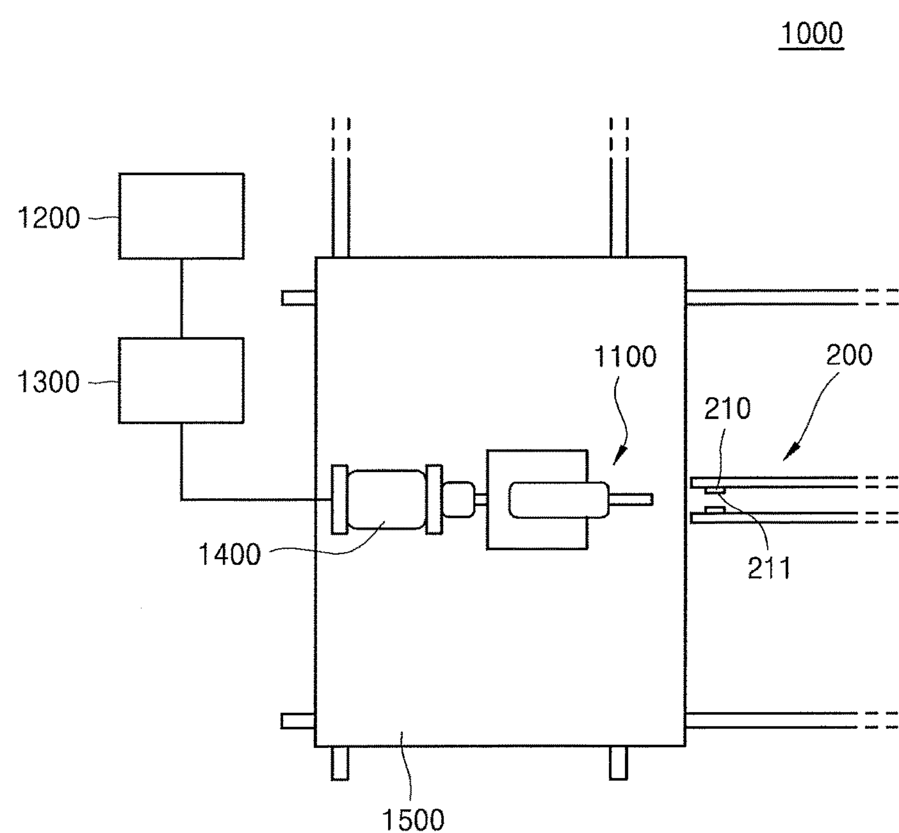
FIG. 7 illustrates a schematic diagram of a cleaning system that cleans a wire clamp according to an exemplary embodiment.
Figure 8:
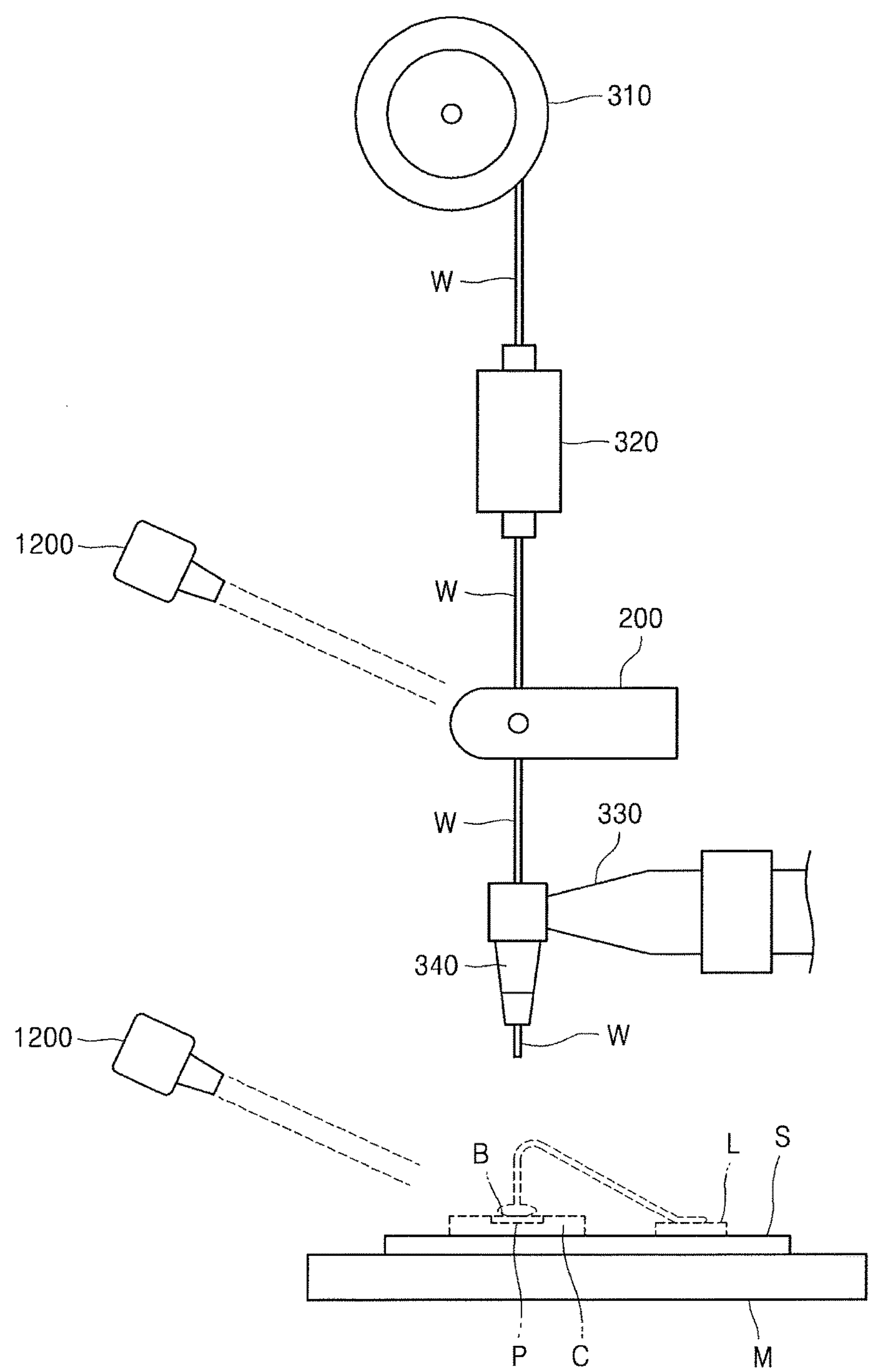
FIG. 8 illustrates a schematic diagram for explaining a detection unit of FIG. 7.

FIG. 7 illustrates a schematic diagram of a cleaning system 1000 that cleans the wire clamp 200 according to an exemplary embodiment. FIG. 8 illustrates a schematic diagram for explaining a detection unit 1200 of FIG. 7.

Referring to FIGS. 2, 7, and 8, the cleaning system 1000 with respect to the wire clamp 200 may include a cleaning apparatus 1100, the detection unit 1200, a control unit 1300, and a driving unit 1400.

The cleaning apparatus 1100 may be the cleaning apparatus 100 described with reference to FIGS. 1 through 6 and may be provided on a stage 1500. The stage 1500 may move the cleaning apparatus 1100 to a location according to a set condition.

The wire clamp 200 may be mounted in a wire bonding apparatus. The wire bonding apparatus may include a spool 310 that is wound with a wire W of a conductive material and may be temporally stored, a wire tension apparatus 320 that may apply tension to the wire W unwound from the spool 310 and may maintain the wire W in a vertical state, the wire clamp 200 that may repeat opening and closing operations and selectively may break the wire W in the vertical state, a transducer 330 that may apply vibration energy to the wire W and may improve bonding of the wire W during wire bonding, and a capillary 340 that may include a minute hole that may be a supply path of the wire W, may cut off the wire W, and may perform wire bonding.

The wire bonding apparatus may electrically connect a substrate S and a semiconductor chip C that are disposed on a workbench M. A ball B formed on a fore-end direction of the wire W may be bonded to a bonding pad P of the semiconductor chip C. Such a wire bonding work may result in an electrical connection of the bonding pad P of the semiconductor chip C and a lead L of the substrate S or a substrate pad.

The detection unit 1200 may transmit contamination information of clamp pads 210 provided in the wire clamp 200 or transmit damage information of the wire W formed between the bonding pad P of the semiconductor chip C and the lead L of the substrate S. The detection unit 1200 may include an electronic microscope capable of detecting the contamination information or the damage information.

The control unit 1300 may receive information detected by the detection unit 1200, compare the detected information and a set reference, and when it is determined that the wire clamp 200 requires cleaning, drive the driving unit 1400. The control unit 1300 may include, for example, a CPU. However, the control unit 1300 may drive the driving unit 1400 according to a determined maintenance cycle and clean the wire clamp 200.

The driving unit 1400 may insert the support unit 121 into a gap between the pair of clamp pads 210 that face each other and are provided in the wire clamp 200 according to a command signal of the control unit 1300 to allow the polishing member 130 to perform reciprocating motion and cleaning on a contaminated surface of the clamp pads 210. The driving unit 1400 may include, for example, a driving motor.

Figure 9:
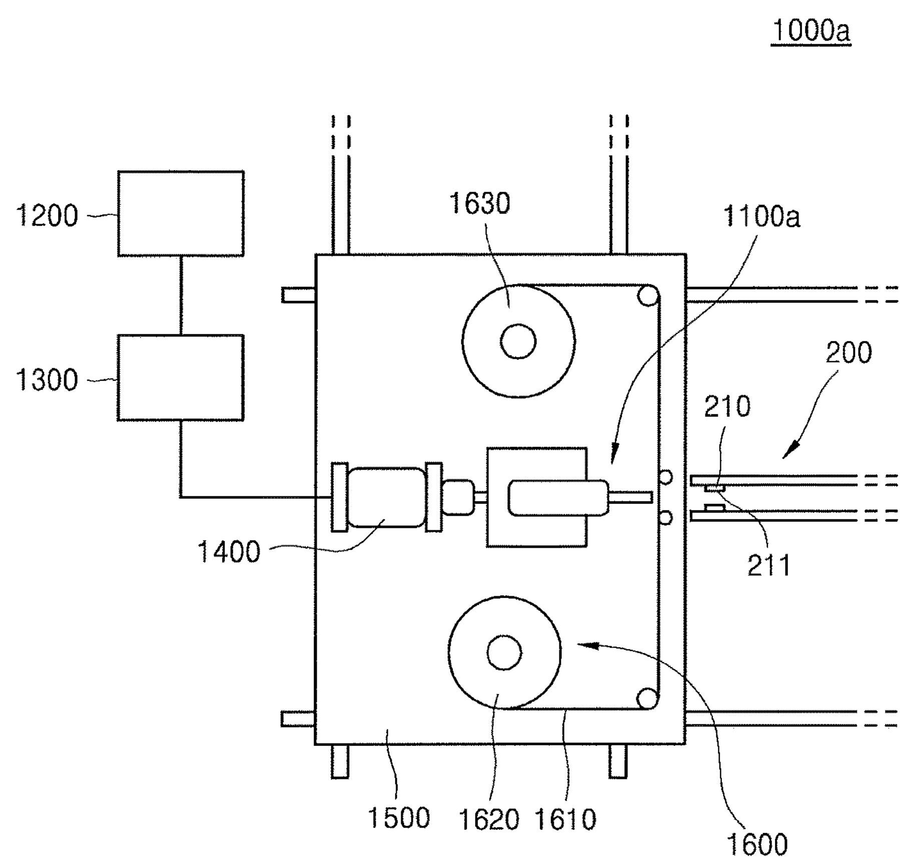
FIG. 9 illustrates a schematic diagram of a cleaning system that cleans a wire clamp according to an exemplary embodiment.

FIG. 9 illustrates a schematic diagram of a cleaning system 1000*a* that cleans the wire clamp 200 according to an exemplary embodiment.

Referring to FIGS. 2 and 9, the cleaning system 1000*a* with respect to the wire clamp 200 may include a cleaning apparatus 1100*a*, the detection unit 1200, the control unit 1300, and the driving unit 1400. However, unlike the cleaning apparatus 1100 of FIG. 7, the cleaning apparatus 1100*a* may not include the fixing unit 140 and may include a polishing tape supply unit 1600 instead. The differences between the cleaning system 1000 of FIG. 7 and the cleaning system 1000*a* will be described below.

The polishing tape supply unit 1600 may supply a polishing tape 1610 to a location adjacent to a fore-end of the tip unit 120. The tip unit 120 of the cleaning apparatus 1100*a* may be inserted into a narrow gap between the pair of clamp pads 210 that face each other by the driving unit 1400 when cleaning is performed. While the cleaning apparatus 1100*a* moves, the polishing tape 1610 may be in contact with the fore-end unit 123 of the tip unit 120, and the support unit 121 may be inserted into the gap between the pair of clamp pads 210 that face each other, and the polishing tape 1610 may also be dragged into the gap between the pair of clamp pads 210 that face each other. The support unit 121 may allow the polishing tape 1610 and one surface 211 of the clamp pads 210 to contact each other. The polishing member 1610 may be wound to move on one surface 211 of the clamp pads 210 so that one surface 211 of the clamp pads 210 may be cleaned.

The polishing tape supply unit 1600 may include a supply roll 1620 that supplies the polishing tape 1610 and a coiling roll 1630 that coils the polishing tape 1610. The supply roll 1620 may be connected to a torque motor in order to supply appropriate tension to the polishing tape 1610. The coiling roll 1630 may be connected to a stepping motor. The polishing tape supply unit 1600 may further include an auxiliary roller for moving the polishing tape 1610 through a set moving path.

By way of summation and review, embodiments may provide an apparatus for cleaning a wire clamp without a dissembling and assembling process, and a defect of the apparatus may be prevented due to, for example, the dissembling and reassembling, and a cleaning time may be reduced. The cleaning apparatus may include a tip that may be inserted into a narrow gap and a polishing tape fixed to the tip. The polishing tape may be fixed to the tip to contact a main surface of the tip, and the tip may perform a cleaning operation by bringing the polishing tape in contact with a cleaning target surface.

Embodiments may provide a cleaning apparatus for cleaning a cleaning target surface without a dissembling and reassembling process. Embodiments may also provide a cleaning system including a cleaning apparatus.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A cleaning apparatus, comprising:

a body;

a tip connected to a first end of the body, the tip including a support extending in a direction away from the body;

a polishing member including a polishing surface; and a fixer to fix the polishing member to the support, wherein:

the support includes a pair of horizontal surfaces that parallel each other and a pair of first inclination surfaces extending from first ends of the pair of horizontal surfaces in a direction opposite to a first end of the tip, and a distance between the pair of first inclination surfaces of the support increases as the pair of first inclination surfaces of the support extend in the direction opposite to the first end of the tip.

2. The cleaning apparatus as claimed in claim 1, wherein the fixer includes a first fixer including a through hole providing an inner side surface and a second fixer engaged with the first fixer, the fixer to fix the polishing member such that the polishing member is fixedly sandwiched between the inner side surface of the first fixer and the support.

3. The cleaning apparatus as claimed in claim 2, wherein the inner side surface of the first fixer includes inner side inclination surfaces corresponding to the pair of first inclination surfaces.

4. The cleaning apparatus as claimed in claim 2, wherein the inner side surface of the first fixer has a shape corresponding to a part of the pair of horizontal surfaces and the pair of first inclination surfaces.

5. The cleaning apparatus as claimed in claim 2, wherein:

the pair of first inclination surfaces include a seating groove accommodating a part of the polishing member, and the first fixer includes a protrusion that is insertable into the seating groove.

6. The cleaning apparatus as claimed in claim 1, wherein:

the support further includes a pair of second inclination surfaces extending from second ends of the pair of horizontal surfaces of the support to the first end of the tip, and a distance between the pair of second inclination surfaces of the support decreases as the pair of second inclination surfaces of the support extend from the second ends of the pair of horizontal surfaces of the support to the first end of the tip.

7. The cleaning apparatus as claimed in claim 6, wherein the first end of the tip is convex.

8. The cleaning apparatus as claimed in claim 1, wherein the body and the tip are detachable from each other.

9. The cleaning apparatus as claimed in claim 1, further comprising a cover to protect the tip.

10. A cleaning system, comprising:

a cleaning apparatus including a polishing member to clean clamp pads provided in a wire clamp, a support to support the polishing member, and a fixer to fix the polishing member to the support;

a detector to provide contamination information of the clamp pads provided in the wire clamp; and a driver to insert the cleaning apparatus into the wire clamp to clean the clamp pads using the polishing member of the cleaning apparatus based on information detected by the detector, wherein:

the support includes a pair of horizontal surfaces that parallel each other and a pair of first inclination surfaces extending from first ends of the pair of horizontal surfaces in a direction opposite to a first end of the support, and a distance between the pair of first inclination surfaces of the support increases as the pair of first inclination surfaces of the support extend in the direction opposite to the first end of the support.

11. The cleaning system as claimed in claim 10, wherein the fixer includes a first fixer including a through hole providing an inner side surface and a second fixer engaged with the first fixer, the fixer to fix the polishing member such that the polishing member is fixedly sandwiched between the inner side surface of the first fixer and the support.

12. The cleaning system as claimed in claim 10, wherein:

the support further includes a pair of second inclination surfaces extending from second ends of the pair of horizontal surfaces to the first end of the support, and a distance between the pair of second inclination surfaces of the support decreases as the pair of second inclination surfaces of the support extend from the second ends of the pair of horizontal surfaces of the support to the first end of the support.

13. The cleaning system as claimed in claim 10, wherein the support has a symmetrical structure.

14. The cleaning system as claimed in claim 10, wherein the polishing member is a diamond polishing tape.

15. A cleaning apparatus, comprising:

a tip including a first end, a pair of horizontal surfaces that parallel each other, and a pair of first inclination surfaces extending from first ends of the opposite horizontal surfaces in a direction opposite to the first end of the tip; and a polishing member folded to cover the first end, the pair of horizontal surfaces, and the pair of first inclination surfaces, wherein a distance between the pair of first inclination surfaces of the tip increases as the pair of first inclination surfaces of the support extend in the direction opposite to the first end of the tip.

16. The cleaning apparatus as claimed in claim 15, wherein the pair of horizontal surfaces include a seating groove accommodating a part of the polishing member.

17. The cleaning apparatus as claimed in claim 15, wherein the tip further includes a pair of second inclination surfaces between the pair of horizontal surfaces and the first end of the tip.

18. The cleaning apparatus as claimed in claim 17, wherein the pair of second inclination surfaces of the tip are formed by chamfering a corner where the pair of horizontal surfaces and the first end of the tip meet each other.

19. The cleaning apparatus as claimed in claim 17, wherein:

a distance between the pair of horizontal surfaces of the tip is about 0.4 mm, and a width of the first end of the tip is about 0.3 mm.

* * * * *